US009196568B2

(12) United States Patent
Fischer et al.

(10) Patent No.: US 9,196,568 B2
(45) Date of Patent: Nov. 24, 2015

(54) ARRANGEMENT AND METHOD FOR MANUFACTURING THE SAME

(71) Applicant: Infineon Technologies AG, Neubiberg (DE)

(72) Inventors: Thomas Fischer, Regensburg (DE); Carsten Ahrens, Pettendorf (DE); Damian Sojka, Regensburg (DE); Andre Schmenn, Sachsenkam (DE); Edward Fuergut, Dasing (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/042,750

(22) Filed: Oct. 1, 2013

(65) Prior Publication Data
US 2015/0091183 A1    Apr. 2, 2015

(51) Int. Cl.
*H01L 23/48* (2006.01)
*H01L 21/768* (2006.01)
*H01L 21/78* (2006.01)

(52) U.S. Cl.
CPC ........ *H01L 23/481* (2013.01); *H01L 21/76877* (2013.01); *H01L 21/78* (2013.01)

(58) Field of Classification Search
USPC ............. 257/774, E23.01, E23.011, E23.067, 257/E23.145
See application file for complete search history.

(56) References Cited

U.S. PATENT DOCUMENTS

2005/0118816 A1    6/2005   Hirler et al.
2012/0228780 A1*   9/2012   Kim et al. ............... 257/774
2013/0026632 A1*   1/2013   Kikuchi et al. ............ 257/753

FOREIGN PATENT DOCUMENTS

DE    102006031407 A1    8/2007
EP         1148544 A1    10/2001

* cited by examiner

*Primary Examiner* — Timor Karimy

(57) ABSTRACT

An arrangement is provided. The arrangement may include: a die including at least one electronic component and a first terminal on a first side of the die and a second terminal on a second side of the die opposite the first side, wherein the first side being the main processing side of the die, and the die further including at least a third terminal on the second side; a first electrically conductive structure providing current flow from the third terminal on second side of the die to the first side through the die; a second electrically conductive structure on the first side of the die laterally coupling the second terminal with the first electrically conductive structure; and an encapsulation material disposed at least over the first side of the die covering the first terminal and the second electrically conductive structure.

16 Claims, 9 Drawing Sheets

ARRANGEMENT AND METHOD FOR MANUFACTURING THE SAME

TECHNICAL FIELD

Various embodiments relate generally to an arrangement and a method for manufacturing the arrangement.

BACKGROUND

The employment of powerful interfaces, such as an universal serial bus (USB) 3.0, a high-definition multimedia interface (HDMI), or a Thunderbolt, leads to increasing requirements of the electrostatic discharge protection diode (ESD protection diode). In order to maintain an optimum protection in case of an electrostatic discharge, the intrinsic resistance of the protection diode needs to be minimized. Within the concept of a transient-voltage-suppression (TVS) diode, the silicon (Si) below the diode generates a significant portion of the internal resistance of the diode. Thus, a thinner silicon increases the performance of the diode. Currently, conventional manufacturing concepts of such products provide a chip processed on both sides having a chip thickness to be achieved in a front-end-of-line (FEOL) process at wafer level. Subsequently, after the transfer of this wafer to the back-end-of-line (BEOL) processing, each single chip is picked up and soldered onto the leadframe by means of a serial process. Such a serial process is slow and therefore, expensive. A lot of efforts were made to realize a processability within the front-end-of-line processing of thinner and thinner wafers. However, the thicknesses for this kind of diodes which were ideal (e.g. about 20 μm) are not yet controllable by means of conventional manufacturing methods within a volume production. The main difficulties of conventional methods regarding ultrathin silicon wafers are: silicon split-offs during the wafer/chip dicing (e.g. sawing); and fissures in the silicon single crystal caused by means of applying a force (e.g. pressure) such as by means of a pick-and-place process (e.g. during the die attaching).

SUMMARY

An arrangement is provided. The arrangement may include: a die including at least one electronic component and a first terminal on a first side of the die and a second terminal on a second side of the die opposite the first side, wherein the first side being the main processing side of the die, and the die further including at least a third terminal on the second side; a first electrically conductive structure providing current flow from the third terminal on the second side of the die to the first side through the die; a second electrically conductive structure on the first side of the die laterally coupling the first terminal with the first electrically conductive structure; and an encapsulation material disposed at least over the first side of the die covering the first terminal and the second electrically conductive structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
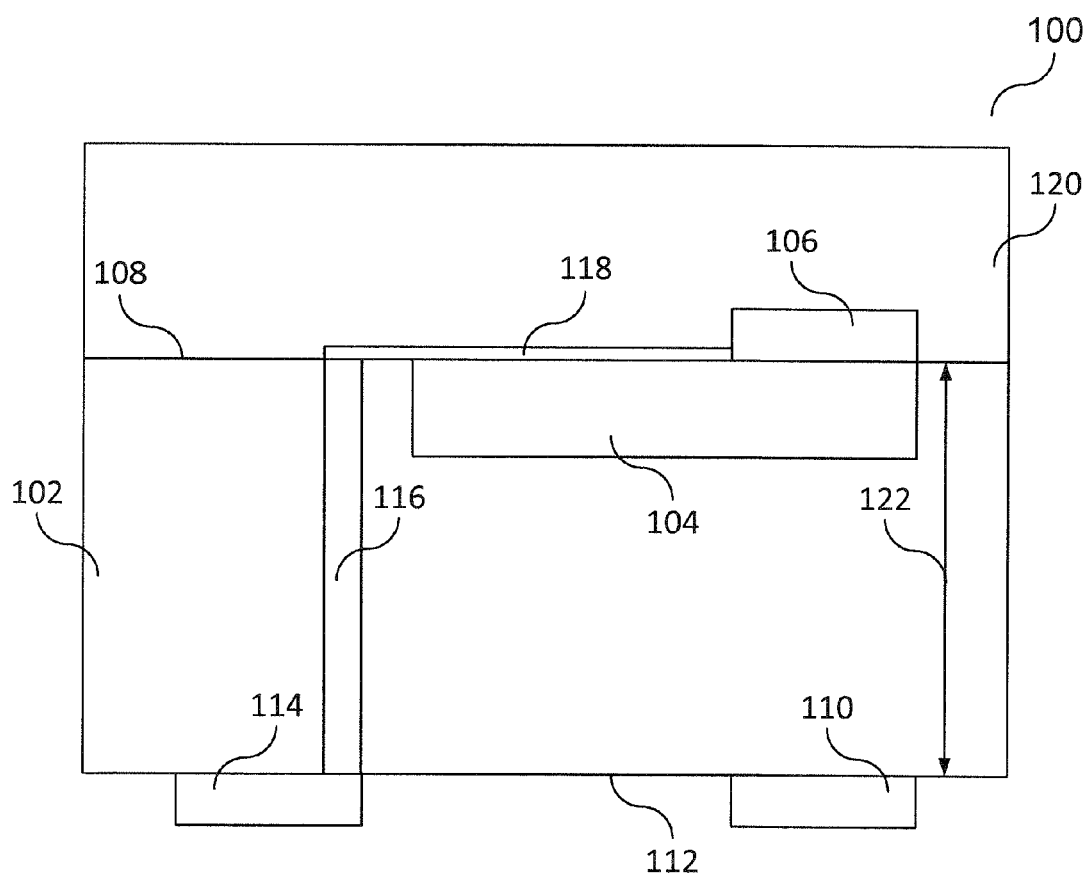
FIG. 1 shows an arrangement according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In conventional products, the silicon (Si) within a silicon chip may be thicker than about 50 μm and thus, may lead to a lower performance. The arrangement (which may also be referred to as a circuit arrangement in the following) and the method for manufacturing such a circuit arrangement may overcome the above described present constraints of the processability of ultrathin wafers (e.g. thin wafers in the front-end-of-line and thin small leadless package (TSLP package)) and furthermore, may allow for an efficient and high volume manufacturing of various predetermined silicon thicknesses being equal to or less than e.g. 50 μm.

A transient-voltage-suppression (TVS) diode may be manufactured alternatively by means of the new manufacturing concept, which may be follow the concepts of the TVS and Embedded Wafer Level Ball Grid Array (eWLB) processing. Thereby, boundaries between back-end (BE) and front-end (FE) may be cancelled. The assembling of the prefabricated components into the mold material may be brought to the beginning within the value chain. Thus, the chip packaging may be coupled with the chip at wafer level. Therefore, the critical process blocks "sawing of thin silicon" and "pick-and-place/die attaching" may be unnecessary. The mold material may provide an elemental carrier for the thinning of silicon during manufacturing, wherein the mold material may be further the final package material at the same time. Thus, the package for the diode may be fabricated at wafer level.

A transient-voltage-suppression (TVS) diode may be an electronic device used to protect sensitive electronic devices from voltage spikes induced on connected wires. These electronic devices may operate by shunting excess current when the induced voltage may exceed the avalanche breakdown potential. The TVS diode may be a clamping device, suppressing all overvoltages above its breakdown voltage. Like all clamping devices, the TVS diode may reset automatically when the overvoltage goes away, but absorbs much more of the transient energy internally than a similarly rated crowbar device. A transient-voltage-suppression diode may be employable either unidirectional or bidirectional. An unidirectional device may operate as a rectifier in the forward direction like any other avalanche diode, but may be made and tested to handle very large peak currents. A bidirectional transient-voltage-suppression diode may be represented by two mutually opposing avalanche diodes in series with one another and connected in parallel with the circuit to be protected. While this representation may be schematically accurate, physically the devices may be manufactured as a single component. A transient-voltage-suppression diode may respond to over-voltages faster than other common over-voltage protection devices such as varistors or gas discharge tubes. The actual clamping may occur in roughly one picosecond, but in a circuit, the inductance of the wires leading to the device may impose a higher limit. This makes transient-voltage-suppression diodes useful for protection against very fast and often damaging voltage transients. These fast over-voltage transients may be present on all distribution networks and may be caused by either internal or external events, such as lightning or motor arcing.

Further, this method may provide various advantages as follows: the silicon thickness may be independent from the package thickness; the mold compound may provide a good electrical isolation/shielding effect (e.g. ESD, light, compare to bare die devices), the fan-out-package may be larger than the chip at wafer level; smaller housing/packaging designs may be allowed; a high compatibility with other interconnect technologies may be provided (e.g. bumping, electrochemical deposition (ECD), ball apply, and the like), a simplified dicing of the components within the mold compound compared to dicing of silicon; and the package pin may be positioned at the silicon back side, wherein the active silicon side may be embedded into the mold material.

The disclosed method may provide a manufacturing process for forming extreme thin (e.g. a thickness being equal to or less than 75 µm or even equal to or less than 50 µm) and very small chip areas (e.g. equal to or less than 1 mm×1 mm). Herein, the mold compound may serve on the one hand as a carrier system during processing (FE and BE) and on the other hand as a housing (or package) on at least five sides of the chip (e.g. in case of a chip having a cuboid shape). In case of a circular shaped chip, two sides may be packaged, wherein at least one of the two circular areas and the sidewall may be covered by the mold compound. Moreover, the method also may be applied for fabricating at least one of: a diode, a single transistor, an electronic filter combination, a LC link, a passive device, and the like.

FIG. 1 shows a circuit arrangement 100 according to various embodiments. The circuit arrangement 100 may include: a die 102 including at least one electronic component 104 and a first terminal 106 on a first side 108 of the die 102 and a second terminal 110 on a second side 112 of the die opposite the first side 108, wherein the first side 108 being the main processing side of the die 102. The die 102 may further include at least a third terminal 114 on the second side 112; a first electrically conductive structure 116 providing current flow from the third terminal on the second side 112 of the die 102 to the first side 108 of the die 102 through the die 102; a second electrically conductive structure 118 on the first side 108 of the die 102 laterally coupling the first terminal 106 with the first electrically conductive structure 116; and an encapsulation material 120 disposed at least over the first side 108 of the die 102 covering the first terminal 106 and the second electrically conductive structure 118. It is to be noted that in various embodiments, the electronic component 104 is formed or processed from the main processing side 108. In other words, the main processing side 108 may be understood as being that side of the wafer, from which the electronic component 108 is formed, e.g. by means of various front end processes.

The circuit arrangement 100 may be formed by at least one die 102 (or chip, e.g. a plurality of dies or chips). By way of example, the at least one die 102 may be a wafer, a part of a wafer, a substrate, a part of a substrate, and the like, wherein the at least one die 102 may be formed at least partially from at least one semiconductor material. The at least one die 102 may further include at least one of a processed wafer, a processed substrate, and the like, wherein the processing may be at least one of the common processes, such as layer deposition, patterning, doping, and/or heat treatment.

The at least one die 102 may be formed at least partially from at least one of the group of semiconductor materials, wherein the group of semiconductor materials may include or consist of: Silicon (Si), Silicon carbide (SiC), Silicon germanium (SiGe), Germanium (Ge), α-Tin (α-Sn), Boron (B), Selenium (Se), Tellurium (Te), Sulfur (S), Gallium phosphide (GaP), Gallium arsenide (GaAs), Indium phosphide (InP), Indium antimonide (InSb), Indium arsenide (InAs), Gallium antimonide (GaSb), Gallium nitride (GaN), Aluminum nitride (AlN), Indium nitride (InN), Aluminum gallium arsenide ($Al_xGa_{1-x}As$), and/or Indium gallium nitride ($In_xGa_{1-x}N$). Moreover, the one or more materials of the one or more semiconductor substrates may be one or more compound semiconductors from the group of compound semiconductors of the following groups of the periodic system: II-V, II-VI, III-VI, I-III-VI, IV-VI and/or V-VI.

The at least one die 102 may have a thickness 122, wherein this thickness 122 may be a distance extending between the first side 108 and the second side 112. The thickness may be in the range from about 0.5 µm to about 0.5 mm, e.g. in the range from about 5 µm to about 50 µm, e.g. in the range from about 1 µm to about 100 µm. In various embodiments, the at least one die 102 may have a thickness which may be equal to or less than 50 µm.

The at least one die 102 may be formed such that its footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one die 102 may be formed such that its footprint may have an area in the range from about 0.1 mm$^2$ to about 100 mm$^2$, e.g. in the range from about 0.25 mm$^2$ to about 2.25 mm$^2$, e.g. in the range from about 0.25 mm$^2$ to about 25 mm$^2$.

The at least one die 102 may be formed such that its body shape may formed from at least one of the group of body shapes, wherein the group may include or consist of: a cube, a cuboid, a cylinder, a parallelepiped, a prism, and the like.

The at least one die 102 may include at least one electronic component (or electronic structure and/or structured element and/or electronic device) 104. The at least one electronic component 104 may be formed at the first side 108 of the at least one die 102 by means of at least one common process, such as layer deposition, patterning, doping, and/or heat treatment. In other words, the at least one electronic component 104 may be formed in the at least one die 102 such that the electronic component 104 may be substantially planar with the first side 108 of the at least one die 102.

Although in FIG. 1 one electronic component 104 is shown, it is understood, that one or more electronic components 104 may be formed at the first side 108 of the at least one die 102 and/or at the second side 112 of the at least one die 102 such that the at least one die 102 may include one or more electronic components 104, such as a plurality of electronic components 104.

The at least one electronic component 104 may be formed from at least one of the group of electronic components, wherein the group of electronic components may include or consist of: a diode (e.g. a TVS diode, a pn diode, a Schottky-diode, and the like), a transistor, a varistor, a bipolar junction transistor, junction gate field-effect transistor, a field effect transistor, a resistor, a capacitor, an inductor, a thyristor, a power transistor, a power metal oxide semiconductor (MOS) transistor, a power bipolar transistor, a power field effect transistor, a power insulated gate bipolar transistor (IGBT), a MOS controlled thyristors, a silicon controlled rectifier, a power schottky diode, a silicon carbide diode, a gallium nitride device, an ASIC, a driver, a controller, electronic filter combination, a LC link, a passive device, a sensor, and the like.

The at least one first terminal 106 may be formed at least partially over the first side 108 of the at least one die 102. Further, the at least one first terminal 106 may be electrically conductively coupled to the at least one electronic component 104.

In various embodiments, the at least one first terminal 106 may be formed such that the at least one first terminal 106 may be formed at least partially either adjacent to the first side 108 of the at least one die 102 and/or adjacent to the at least one second electrically conductive structure 118 as will be described in more detail further below. Furthermore, the at least one first terminal 106 may be substantially free from any wire bonding, wherein the at least one first terminal 106 may be electrically connected via the at least one first electrically conductive structure 116 and the at least one second electrically conductive structures 118.

In various embodiments, the at least one first terminal 106 and the at least one electronic component 104 may be either electrically conductively coupled directly or indirectly, such as by means of at least one further electrical interconnection.

The at least one first terminal 106 may be formed by means of at least one common process, such as layer deposition, patterning, heat treatment, and the like.

The at least one first terminal 106 may be formed from at least one of the group of electric conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one first terminal 106 may be formed such that its footprint may be formed from at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one first terminal 106 may be formed such that its footprint may have an area in the range from about 10 μm$^2$ to about 10000 μm$^2$, e.g. in the range from about 10 μm$^2$ to about 1000 μm$^2$, e.g. in the range from about 50 μm$^2$ to about 5000 μm$^2$.

The at least one first terminal 106 may be formed such that its body shape may formed from at least one of the group of body shapes, wherein the group of body shapes may include or consist of: a cube, a cuboid, a cylinder, a parallelepiped, a prism, and the like.

The at least one second terminal 110 may be formed at least partially over the second side 112 of the at least one die 102. By way of example, the at least one second terminal 110 may be formed at least partially adjacent to the second side 112 of the at least one die 102.

The at least one second terminal 110 may be formed by means of at least one common process, such as layer deposition, patterning, heat treatment, and the like.

The at least one second terminal 110 may be formed from at least one of the group of electric conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one second terminal 110 may be formed such that its footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one second terminal 110 may be formed such that its footprint may have an area in the range from about 10 μm$^2$ to about 10000 μm$^2$, e.g. in the range from about 10 μm$^2$ to about 1000 μm$^2$, e.g. in the range from about 50 μm$^2$ to about 5000 μm$^2$.

The at least one second terminal 110 may be Ruined such that its body shape may formed from at least one of the group of body shapes, wherein the group of body shapes may include or consist of: a cube, a cuboid, a cylinder, a parallelepiped, a prism, and the like.

In various embodiments, the at least one second terminal 110 may be formed on the second side 112 of the at least one die 102 opposite the at least one electronic component 104 and/or opposite the at least one first terminal 106 on the first side 108 of the at least one die.

The at least one third terminal 114 may be formed at least partially over the second side 112 of the at least one die 102. Further, the at least one third terminal 114 may be coupled electrically conductively to the at least one first electrically conductive structure 116. The at least one first electrically conductive structure 116 may be coupled electrically conductively to the at least one second electrically conductive structure 118. The at least one second electrically conductive structure 118 may be coupled electrically conductively to the at least one first terminal 106 and/or to the at least one electronic component 104, wherein further the at least one first terminal 106 may be may be coupled electrically conductively to the at least one electronic component 104. By way of example, the at least one third terminal 114 may be formed such that the at least one third terminal 114 may be formed at least partially either adjacent to the second side 112 of the at least one die 102 and/or adjacent to the at least first electrically conductive structure 116 and thus, may be coupled electrically conductively to the at least one second electrically conductive structure 118 as will be described in more detail further below, via the at least first electrically conductive structure 116. Therefore, a current flow may be provided vertically (or perpendicular) with respect to the first side 108 of the at least one die 102 and the second side 112 of the at least one die 102 from the at least one third terminal 114 on the second side 112 of the at least one die 102 to the first side 108 of the at least one die 102 via the at least one first electrically conductive structure 116 and further the current flow may be provided laterally from the at least one first electrically conductive structure 116 at the first side 108 of the at least one die 102 to the at least one first terminal 106 and/or the at least one electronic component 104 via the at least one second electrically conductive structure 118 on the first side 108 of the at least one die 102.

The at least one third terminal 114 may be formed by at least one common process, such as layer deposition, patterning, heat treatment, and the like. In various embodiments, the at least one second terminal 110 and the at least one third terminal 114, may be coupled electrically conductively to the at least one electronic component 104.

The at least one third terminal 114 may be formed from at least one of the group of electric conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one third terminal 114 may be formed such that its footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one third terminal 114 may be formed such that its footprint may have an area in the range from about 10 µm$^2$ to about 10000 µm$^2$, e.g. in the range from about 10 µm$^2$ to about 1000 µm$^2$, e.g. in the range from about 50 µm$^2$ to about 5000 µm$^2$.

The at least one third terminal 114 may be formed such that its body shape may formed from at least one of the group of body shapes, wherein the group of body shapes may include or consist of: a cube, a cuboid, a cylinder, a parallelepiped, a prism, and the like.

The at least one first terminal 106, the at least one second terminal 110, and the at least one third terminal 114, may be formed such that each of the terminals, 106, 110, and 114, may have a different footprint, body shape, and/or volume. In other words, each terminal of the terminals, 106, 110, and 114, may be formed differently from the others with respect to their footprint, body shape, and/or volume.

Although in FIG. 1 three terminals, 106, 110, and 114, are shown, it is understood, that more than three terminals may be formed at least partially over the first side 108 of the at least one die 102 and/or over the second side 112 of the at least one die 102, such as a multiplicity of terminals.

The at least one first electrically conductive structure 116 may be formed to provide a current flow from the third terminal on the second side 112 of the at least one die 102 to the first side 108 of the at least one die 102 through the at least one die 102 and thus, may be a vertical (or perpendicular) current flow with respect to the first side 108 and the second side 112 of the at least one die 102. The at least one first electrical conductive structure 116 may be formed such that the at least one first electrically conductive structure 116 may extend at least partially between the first side 108 of the at least one die 102 and the second side 112 of the at least one die 102, wherein the at least first electrically conductive structure 116 may be formed such that both ends of the at least one first electrically conductive structure 116 at the first side 108 and the second side 112 of the at least one die 102 may allow to electrically couple, interconnect, or contact any electrically conductive element, such as a terminal, a wire, an electronic component, and the like.

Although in FIG. 1 one first electrically conductive structure 116 is shown, it is understood, that one or more first electrically conductive structures 116 may be formed in the at least one die 102, such as a plurality of electrically conductive structures 116. The at least one first electrically conductive structure 116 may extend at least partially between the first side 108 of the at least one die 102 and the second side 112 of the at least one die 102.

In various embodiments, the at least one first electrically conductive structure 116 may be formed at least partially through the at least on die 102. Forming such at least one first electrically conductive structure 116 may be performed by means of e.g. a through silicon via (TSV). The TSV may be a vertical electrically conductive connection (i.e. a vertical interconnect access, via) passing completely through the at least one die 102.

The at least one first electrically conductive structure 116 may be formed in a first step by means of at least one of the group of ablating methods, wherein the group of ablating methods may include or consist of: etching (e.g. dry- and wet etching), plasma etching, reactive ion etching, electron-beam lithography, ion-beam lithography, laser drilling, laser ablation, and the like.

Subsequently, the at least one through-hole may be filled at least partially by at least one of the group of electrically conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like, an electrically conductive paste including electrically conductive particles (e.g. nanoparticles), electrically conductive particles (e.g. nanoparticles) which may be annealed and/or sintered for curing by means of a common heat treatment process, and the like, thereby forming one implementation of the at least first electrically conductive structure 116.

Further, the at least one TSV may include one or more further layers of an isolating material deposited at the sidewalls of the through-hole, wherein such an isolating material may include e.g. a dieelectric material (e.g. a high-k dielectric material), such as silicon dioxide ($SiO_2$), silicon nitride (SiN), aluminum oxide ($Al_2O_3$), titanium oxide ($TiO_2$), tantalum oxide, hafnium silicate, zirconium silicate, hafnium dioxide and zirconium dioxide, and the like.

The at least one first electrically conductive structure 116 may be formed such that its footprint at the first side 108 and second side 112 of the at least one die 102, may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one first electrically conductive structure 116 may be formed such that its body shape may formed from at least one of the group of body shapes, wherein the group of body shapes may include or consist of: a cube, a cuboid, a cylinder, a parallelepiped, a prism, and the like.

In various embodiments, the at least one first electrically conductive structure 116 further may be formed at least partially inclined (or tilted/slanted) with respect of the first side 108 and the second side 112 of the at least one die 102 through the at least one die 102, wherein the term "inclined" may describe that the holes, on the first side 108 and second side 112 of the at least one die, may be formed at different positions at the both surfaces of the first side 108 and the second side 112 of the at least one die 102. In other words the through-hole may be formed such that the inlet apertures at the first side 108 and the second side 112 of the at least one die 102, may be not superimposed upon each other (or being arranged congruently at the same position at the first side 108 and the second side 112 of the at least one die 102) and thus, the through-hole may be formed inclined through the at least one die 102.

At least one second electrically conductive structure 118 may be formed at least partially over the first side 108 of the at least one die 102. In various embodiments, the at least one second electrically conductive structure 118 may be formed either as a structured layer or as a flat layer on the first side 108 of the at least one die 102. In case of a structured layer, the at least second electrically conductive structure 118 may be structured at least partially by at least one of the following group of structuring methods, wherein the group of structuring methods may include or consist of: etching (e.g. dry- and wet etching), plasma etching, sputtering, laser ablation, reactive ion etching, e-beam, nanoimprint, or ion beam lithography, scanning electrochemical imprinting, heat treatment, annealing, and the like.

Although in FIG. 1 one second electrically conductive structure 118 is shown, it is understood, that one or more second electrically conductive structures 118 may be formed at least partially over the first side 108 of the at least one die 102, such as a plurality of second electrically conductive structures 116.

In various embodiments, the at least one second terminal 110 and the at least one third terminal 114 may be formed at least partially over spatially separated regions on the second side 112 of the at least one die 102, wherein the both terminals, 110 and 114, may be formed such that both terminals may be separated spatially from each other.

In various embodiments, the at least one third terminal 114 may be formed adjacent to the at least one first electrically conductive structure 116 such that the at least one third terminal 114 and the at least one first electrically conductive structure 116 may be coupled electrically conductively with each other. The at least one second terminal 110 may be formed adjacent to the second side 112 of the at least one die 102 opposite the at least one electronic component 104 and/or the at least one first terminal 106 formed at the first side 108 of the at least one die 102 and further, the at least one second terminal 110 may be formed adjacent to a region on the second side 112 of the at least one die 102 which may be spatially separated from that region where the at least one third terminal 114 may be formed.

In various embodiments, the at least one second electrically conductive structure 118 and the first terminal 106 may be formed over the first side 108 of the at least one die 102 either individually or commonly, such that the at least one second electrically conductive structure 118 and the first terminal 106 may substantially form together one common planar layer having the same level. In other words, the at least one second electrically conductive structure 118 and the at least one first terminal 106 may form one common plane together.

In various embodiments, the at least one second electrically conductive structure 118 and the at least one first terminal 106 may be formed substantially individually such that the at least one second electrically conductive structure 118 and the at least one first terminal 106 may have a different level to each other. The at least one second electrically conductive structure 118 may be formed from at least one of the group of electric conductive materials, wherein the group of electric conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one second electrically conductive structure 118 may be at least coupled electrically conductively to the at least first electrically conductive structure 116 and to the at least one first terminal 106, wherein the at least one first terminal 106 and the at least one first electrically conductive structure 116 may be laterally electrically conductively coupled by means of the at least one second electrically conductive structure 118 (or via the at least one second electrically conductive structure 118).

The encapsulation material 120 may be formed at least partially over the first side 108 of the at least one die 102, wherein the encapsulation material 120 may be formed such that the encapsulation material 120 may cover at least partially the at least one first terminal 106 and the at least one second electrically conductive structure 118.

The encapsulation material 120 may be formed from at least one of the group of mold material, wherein the group of mold material may include or consist of: polyester resin, vinyl ester resin, synthetic resin, fiberglass, epoxy, polymers, polyimide (PI), polyamide (PA), Polyamide-imide (PAI), poly (methyl glutarimide) (PMGI), SU-8, Phenol formaldehyde resins (PF), Poly(methyl methacrylate) (PMMA), any combination of these encapsulation materials, and the like.

The encapsulation material 120 may be formed by means of at least one of the group of molding methods, wherein the group of molding methods may include or consist of compression molding, spin coating, injection molding, laminating, transfer molding, matrix molding, and the like.

In various embodiments, the first side 108 and the second side 112 of the at least one die 102 may include at least one electrically conductive contact. In other words, the the first side 108 and the second side 112 of the at least one die 102 may include at least one ohmic contact.

The term "ohmic contact" refers to a junction between two conductors that has a linear current-voltage (I-V) curve as with Ohm's law and usually referring to a junction inside a electronic device between a semiconductor and a current-carrying wire. Ohmic contacts are used to allow charge to flow in both directions between the two conductors, without blocking due to rectification or excess power dissipation due to voltage thresholds. Ohmic contacts on semiconductors are typically constructed by depositing thin metal films of a carefully chosen composition, possibly followed by annealing to alter the semiconductor-metal bond. Once the metal film is deposited it can in turn be easily contacted to a metallic lead because metal-metal junctions are always ohmic contacts. This pathway allows electrical access to the semiconductor from the outside. Low-resistance, stable contacts are critical for the performance and reliability of integrated circuits and their preparation and characterization are major efforts in circuit fabrication. The fundamental steps in ohmic contact fabrication are semiconductor surface cleaning, contact metal deposition, patterning and annealing. In various embodiments, at least over the first side 108 and the second side 112 of the at least one die 102, at least one galvanically or electrolessly plated contact may be formed. The ohmic contact may be formed by means of e.g. electroless plating or electroplating or galvanizing.

The ohmic contact may be deposited by at least one of the group of coating materials, wherein the group of coating materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

In various embodiments, at least over the first side 108 and the second side 112 of the at least one die 102, at least one sputtered contact may be formed, wherein such a sputtered contact may be formed by means of sputtering to obtain a thin film deposition at least over the first side 108 and/or the second side 112 of the at least one die 102.

The sputtered contact may be deposited by at least one of the group of coating materials, wherein the group of coating materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

In various embodiments, the at least one die 102 may have a thickness 122 which may be equal to or less than e.g. 75 µm, or may be equal to or less than 50 µm.

In various embodiments, at least one of the at least one first electrically conductive structure 116 and/or the at least one second electrically conductive structure 118 may formed by means of an electrically conductive track.

Figure 2:
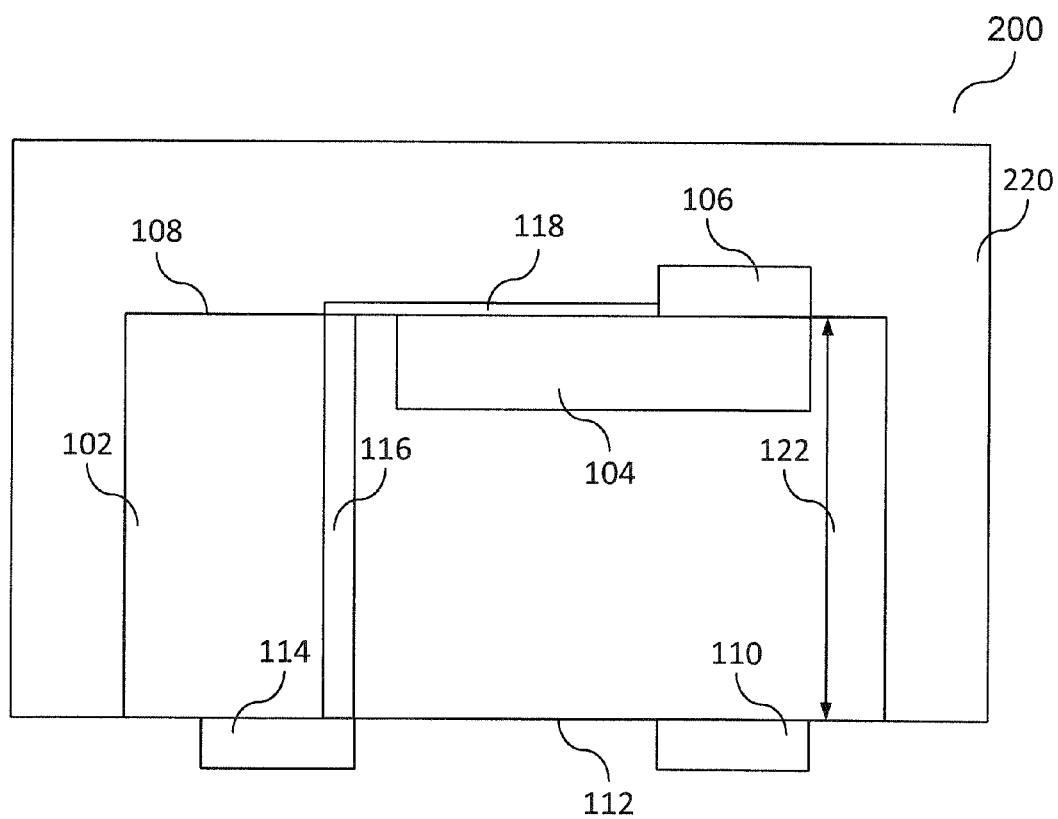
FIG. 2 shows an arrangement according to various embodiments

FIG. 2 shows an arrangement 200 according to various embodiments. The arrangement 200 may include the arrangement 100 as described above.

Further, the arrangement 200 may include an encapsulation material 220 which may be formed at least partially over the first side 108 and the at least one sidewall of the at least one die 102, wherein the encapsulation material 220 may be formed such that it may cover at least the at least one first terminal 106 the at least one second electrically conductive structure 118, and/or the at least one sidewall of the at least one die 102.

The encapsulation material 220 may be formed from at least one of the group of mold materials, wherein the group of mold materials may include or consist of: polyester resin, vinyl ester resin, synthetic resin, fiberglass, epoxy, polymers, polyimide (PI), polyamide (PA), Polyamide-imide (PAI), poly(methyl glutarimide) (PMGI), SU-8, Phenol formaldehyde resins (PF), Poly(methyl methacrylate) (PMMA), any combination of these encapsulation materials, and the like.

The encapsulation material 220 may be formed by means of at least one of the group of molding methods, wherein the group of molding methods may include or consist of: compression molding, spin coating, injection molding, laminating, transfer molding, matrix molding, and the like.

Figure 3:
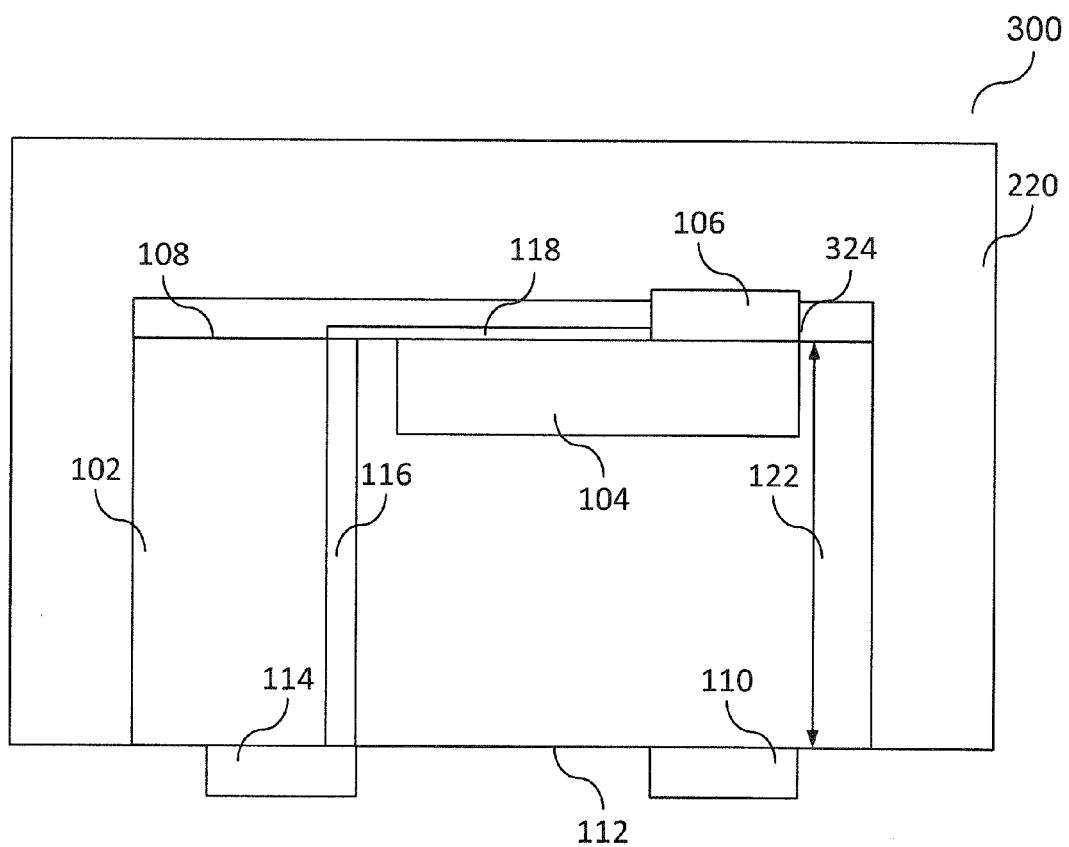
FIG. 3 shows an arrangement according to various embodiments.

FIG. 3 shows an arrangement 300 according to various embodiments. The arrangement 300 may include at least one of the arrangement 100 of FIG. 1 or the arrangement 200 of FIG. 2 as described above.

Further, the arrangement 300 may include a redistribution layer (RDL) 324. The RDL 324 may be formed at least over the first side 108 of the at least one die 102. Furthermore, the RDL may be formed at least partially over at least the at least one second electrically conductive structure 118. The RDL 324 may be formed by means of at least one conductive layer.

In various embodiments, the RDL 324 may be formed by a plurality of layers, wherein at least one layer of the plurality of layers may be conductive, wherein at least another layer of the plurality of layers may be formed from at least one dielectric material.

The at least one conductive layer of the RDL 324 may be formed from at least one of the group of conductive materials, wherein the group of conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one dielectric layer of the RDL 324 may be formed from at least one of the group of dielectric materials, wherein the group of dielectric materials may include or consist of: silicon dioxide ($SiO_2$), silicon nitride (SiN), aluminum oxide ($Al_2O_3$), polyimide, polyamide, titanium dioxide ($TiO_2$), tantalum oxide, yttrium oxide, hafnium oxide, zirconium oxide, and the like.

The at least one RDL 324 may be a structured layer. The RDL 324 may be formed by means of at least one of the following group of structuring methods, wherein the group of structuring methods may include or consist of: etching (e.g. dry- and wet etching), plasma etching, laser ablation, sputtering, e-beam, nanoimprint, or ion beam lithography, scanning electrochemical imprinting, heating treatment, annealing, and the like.

Figure 4:
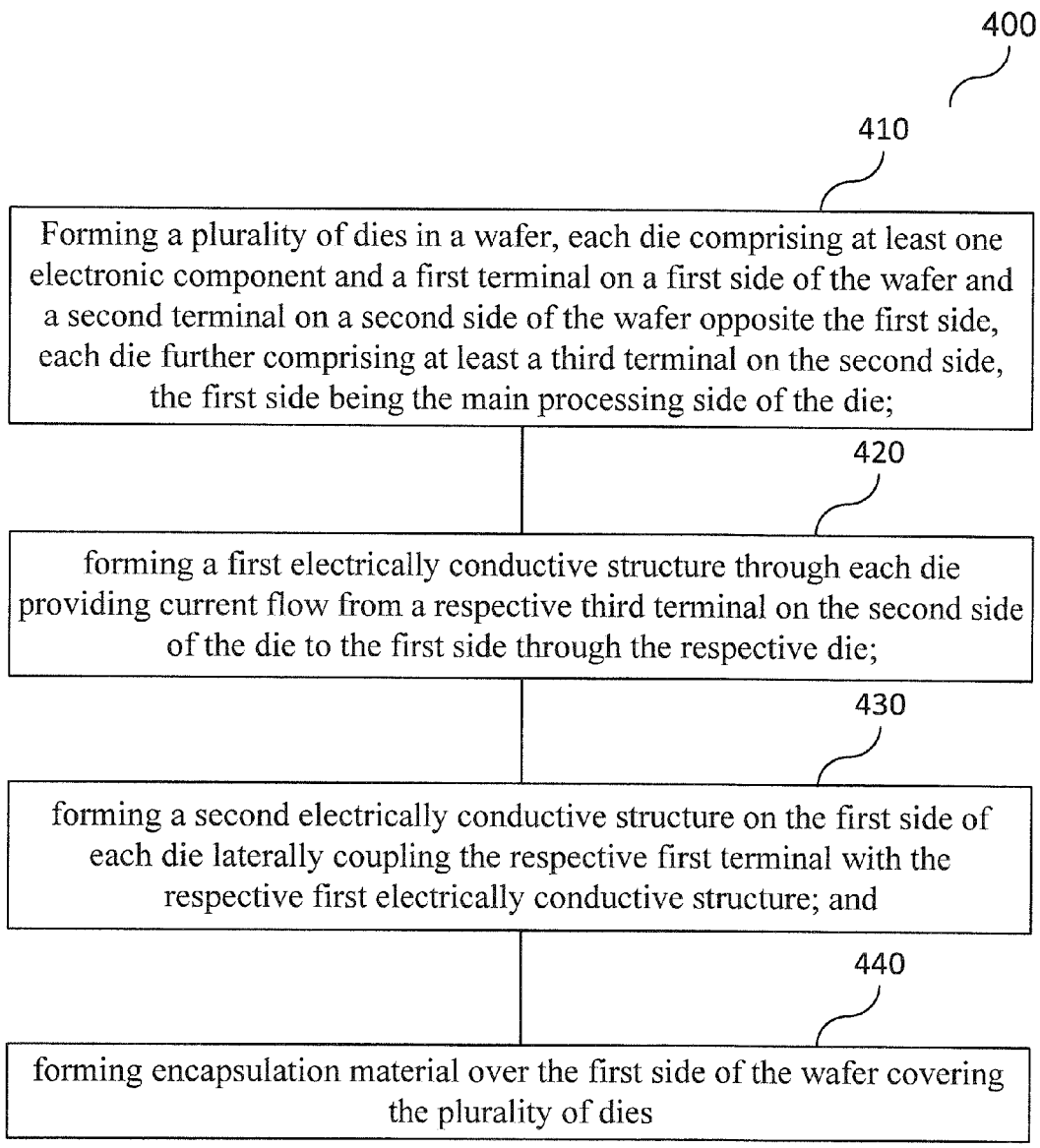
FIG. 4 shows a method for manufacturing an arrangement according to various embodiments.

FIG. 4 shows a method 400 for manufacturing an arrangement in accordance with various embodiments. The method 400A may include: forming a plurality of dies in a wafer, wherein each die of the plurality of dies including at least one electronic component and a first terminal on a first side of the wafer and a second terminal on the second side of the wafer opposite the first side and each die may further include at least a third terminal on the second side of the die and the first side may be the main processing side of the dies (in 410); forming a first electrically conductive structure through each die providing current flow from a respective third terminal on the second side of the respective die to the first side of the respective die through the respective die (in 420); forming a second electrically conductive structure on the first side of each die laterally coupling the respective first terminal with the respective first electrically conductive structure (in 430); and forming encapsulation material over the first side of the wafer covering the plurality of dies (in 440).

The method 400 may be applied to at least one of the arrangements, 100, 200, or 300 as described above, wherein at least one of the arrangements, 100, 200, or 300, may be formed in a wafer. In other words, a plurality of at least one of the arrangements, 100, 200, or 300, may be formed in a wafer. Thus, each die of the plurality of dies may have a first electrically conductive structure formed in the at least one die (e.g. through the at least one die) and may further have a second electrically conductive structure and a first terminal on the first side of each die of the plurality of dies according to the arrangements, 100, 200, or 300.

In various embodiments, the at least one wafer may be a wafer, a part of a wafer, a substrate, a part of a substrate, a carrier, a part of a carrier, and the like. The at least one wafer may further include at least one of a processed wafer, a processed substrate, a processed carrier, and the like.

The at least one wafer may be formed from at least one of the group of semiconductor materials, wherein the group of semiconductor materials may include or consist of: Silicon (Si), Silicon carbide (SiC), Silicon germanium (SiGe), Germanium (Ge), α-Tin (α-Sn), Boron (B), Selenium (Se), Tellurium (Te), Sulfur (S), Gallium phosphide (GaP), Gallium arsenide (GaAs), Indium phosphide (InP), Indium antimonide (InSb), Indium arsenide (InAs), Gallium antimonide (GaSb), Gallium nitride (GaN), Aluminum nitride (AlN), Indium nitride (InN), Aluminum gallium arsenide ($Al_xGa_{1-x}As$), and/or Indium gallium nitride ($In_xGa_{1-x}N$). Moreover, the one or more materials of the one or more semiconductor substrates may be one or more compound semiconductors from the group of compound semiconductors of the following groups of the periodic system: II-V, II-VI, III-VI, I-III-VI, IV-VI and/or V-VI.

The at least one wafer may have a first side and a second side opposite the first side, wherein the first side may be main processing side which may be processed, e.g. by means of at least one previous front-end-of-line (FEOL) process, and the second side may be a side which may be processed subsequently by means of at least one process (e.g. a back-end-of-line process, BEOL), such as thinning (e.g. by means of grinding the wafer), forming a back side metallization, diffusion soldering, and the like.

The at least one wafer may have a footprint of at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

In case of a circular shaped wafer, the at least one wafer may have a diameter in the range from about 1 mm to about 1000 mm, e.g. in the range from about 25 mm to about 450 mm, e.g. in the range from about 1 mm to about 500 mm.

The at least one wafer may have a thickness, wherein the thickness may be a distance extending between the first side and the second side of the at least one wafer. The thickness of the at least one wafer may be in the range from about 1 μm to about 10 mm, e.g. in the range from about 250 μm to about 1 mm, e.g. in the range from about 100 μm to about 1000 μm.

In the at least one wafer, a plurality of dies may be formed according to the arrangements, 100, 200, or 300, wherein the individual dies of the plurality of chips may be formed by means of a subsequent separating (e.g. dicing or individualizing) of dies from the plurality of dies from the wafer by means of a thinning process of the wafer.

In various embodiments, the plurality of dies may be formed in the wafer such as forming an array structure, wherein the plurality of dies may be formed in the wafer such that the dies may be separated spatially from each other by a predetermined distance. The plurality of dies may be arranged over the wafer such that one or more trenches (e.g. a plurality of trenches) may be formed subsequently between the plurality of dies having a predetermined width.

In various embodiments, the method 400 may further include thinning the wafer from the second side so that the encapsulation material may hold mechanically the plurality of dies. In other words, the encapsulation material may serve after thinning as an auxiliary carrier or as a support for the plurality of dies. By way of example, thinning the wafer may be performed by means of grinding the wafer from the second side of the wafer.

The encapsulation material may be formed as described above. The encapsulation material may be formed such that each die may be covered at least partially by the encapsulation material on at least on the main processing side (or the first side) and at least on one sidewall of the at least one die, wherein the encapsulation material may cover at least the first terminal and the at least one electrically conductive structure. In other words, the encapsulation material may cover each die of the plurality of dies such that at least the at least one sidewall and/or the first side of the at least one die may be covered at least partially by the encapsulation material and thus, each die of the plurality of dies may be hold by the encapsulation even in case that the wafer material may be removed, e.g. by means of grinding the wafer from the second side of the wafer.

The encapsulation material may form an auxiliary support (e.g. an elemental support or carrier) for the plurality of dies, such that the dies may be supported or carried by means of the encapsulation material after dicing the plurality of dies by means of thinning the wafer and thus, the encapsulation material may provide or serve as as a support or carrier and as a packaging for the plurality of dies on at least the first side and the sidewalls of the plurality of dies. In other words, the wafer material may be removed such that the plurality of dies may be exposed from the wafer material from its second side and may be individualized such the the plurality of dies may be supported and packaged at least on its first side (or main processing side) and sidewalls of the plurality of dies by means of the encapsulation material.

In various embodiments, the method 400 may further include: forming one or more trenches, such as a plurality of trenches, into the wafer between the dies; wherein the encapsulation material may be formed at least partially on the sidewalls of the trenches. In other words, the at least one trench may be formed between at least two individual arrangements of the array formed by the plurality of dies which may be formed in the wafer.

The plurality of trenches may be formed by at least one of the group of trench forming processes, wherein the group of trench forming processes may include or consist of: mechanical sawing, etching (e.g. dry- and wet etching), plasma etching, laser ablation, and the like.

In various embodiments, the method 400 may further include: removing wafer material from the second side of the wafer to expose at least partially the encapsulation material formed in the trenches.

In various embodiments, the method 400 may further include: removing wafer material from the second side of the wafer to expose at least partially the encapsulation material formed in the trenches, wherein the respective at least one second terminal and the respective at least one third terminal may be formed on the second side of the respective die of the plurality of dies after removing wafer material from the second side of the wafer, wherein the respective at least one second terminal and the respective at least one third terminal may be formed by means of at least one of the methods as described above.

In various embodiments, removing wafer material from the second side of the wafer may be performed by means of thinning the wafer from the second side of the wafer, so that the encapsulation material mechanically holds the plurality of dies to singularize (e.g. dicing) the plurality of dies by means of the trenches formed between the plurality of dies, wherein the plurality of dies may be held together by means of the encapsulation material covering at least partially the plurality of dies at their first sides (i.e. main processing sides) and the at least one sidewall.

In various embodiments, the common process of thinning and singularizing the plurality of dies by means of one process step may achieve a total thickness of at least one of the dies and the encapsulation material covering at least partially the respective at least first terminal, the respective at least first electronic component, and the respective at least one second electrically conductive structure which may be e.g. equal to or less than 400 μm, or e.g. equal to or less than 300 μm, or e.g. equal to or less than 200 μm, or e.g. equal to or less than 100 μm, or e.g. equal to or less than 75 μm, or e.g. equal to or less than 50 μm.

In various embodiments the encapsulation material may cover at least partially each die of the plurality of dies on at least the first side and the sidewalls and may provide or serve as a packaging of each die of the plurality of dies after the dicing, wherein the second side may be exposed, or in other words, the second side of each die of the plurality of dies may be substantially free from encapsulation material.

In various embodiments, the method 400 may further include: forming an insulating layer over the second side of at least one die of the plurality of dies after the process of removing wafer material from the second side of the wafer; and forming openings in the insulating layer to expose at least partially the respective at least first electrically conductive structure and at least a portion of the wafer material; wherein the respective at least one second terminal and the respective at least one third terminal may be formed on the respective second side of the at least one die of the plurality of dies in the openings.

In various embodiments, the openings may be formed by means of at least one of the group of ablation methods, wherein the group of ablation methods may include or consist of: etching (e.g. dry- and wet etching), plasma etching, sputtering, laser ablation, e-beam, nanoimprint, or ion beam lithography, scanning electrochemical imprinting, heat treatment, annealing, and the like.

In various embodiments, the respective at least one second terminal and the respective at least one third terminal may be formed on the respective second side of the at least one die of the plurality of dies in the openings by means of at least one common process, such as layer deposition, patterning, doping, and/or heat treatment.

In various embodiments, the plurality of dies carried within the encapsulation material may be individualized (or diced) by means of separating the plurality of dies, wherein separating the plurality of dies may be performed by means of at least one commen process, such as mechanical cutting, mechanical sawing, etching (dry- and wet etching), laser cutting, and the like. Dicing the plurality of dies may be further performed by means of separating the plurality of dies in the plurality of trenches between the plurality of dies such that the sidewalls of the plurality of dies may be covered by means of the encapsulation material after the dicing process. Thus, the kerf to be formed during dicing may be smaller than the width of the plurality of trenches between the plurality of dies.

Figure 5:
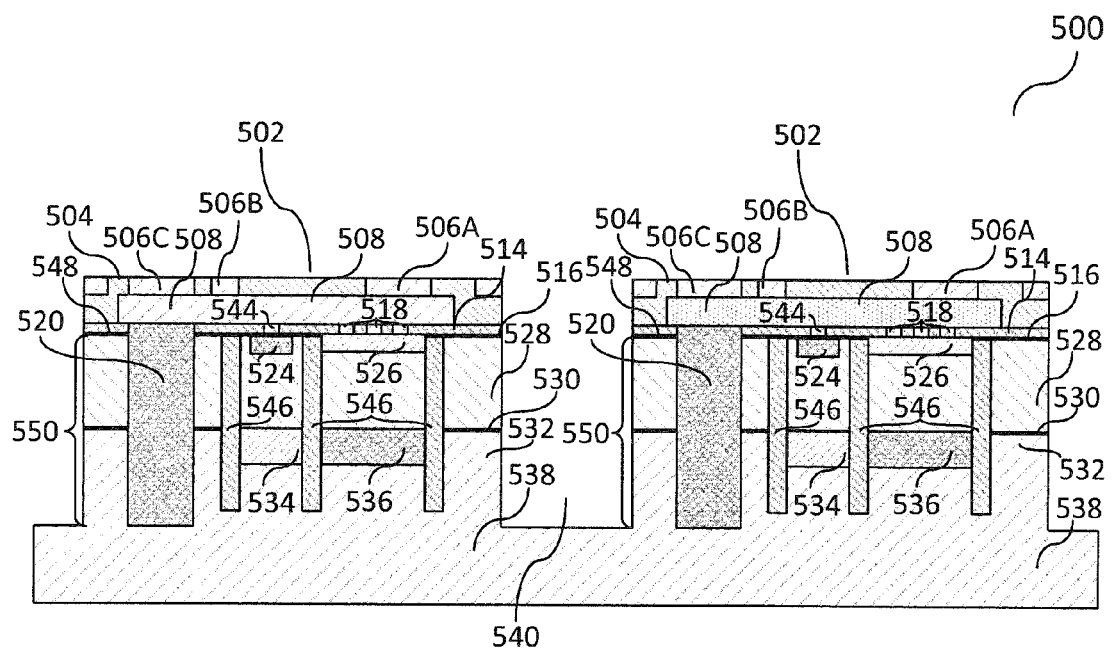
FIG. 5 shows a circuit arrangement according to various embodiments.

FIG. 5 shows an circuit arrangement 500 according to various embodiments. The circuit arrangement 500 may include: a plurality of chips 502 (i.e. the circuit arrangement 500 may be formed by means of a plurality of chips 502), wherein each chip of the plurality of chips 502 may include at least one die 550 which may be formed by means of at least one undoped layer 532 and at least one doped layer 528 formed in or over a wafer 538; further at least one diode (e.g. a TVS diode, a pn diode, a Schottky-diode, and the like) and/or at least one electronic device which may be formed in each die 550 or at the first side 542 of each die 550 of the plurality of chips 502; a plurality of trenches 540 which may be formed between the plurality of chips 502; at least one first terminal 506A, at least one second terminal 506B, and at least one third terminal 506C which may be formed over the first side 542 of each die 550 of the plurality of chips 502; at least one first electrically conductive structure 520 (e.g. a through silicon via, TSV) which may be formed to a predetermined depth of a desired silicon thickness of the final product (e.g. formed to a depth being equal to or less than 75 μm or even 50 μm); at least one second electrically conductive structure 508 which may be formed over the first side 542 of each die 550 of the plurality of chips 502 and laterally electrically conductively coupling the at least one first terminal 506A, the at least one second terminal 506B, and the at least one third terminal 506C with the at least one first electrically conductive structure 520, wherein the at least one second electrically conductive structure 508 may be electrically conductively coupled to the at least one diode via at least one electrically conductive contact 544, and/or the at least one electronic device via at least one or more electrically conductive contacts 518 (e.g. three electrically conductive contacts); at least one insulating top barrier layer 514 which may be formed over the first side 542 of the plurality of chips 502; a plurality of insulating barriers 546 which may be formed laterally and between the at least one diode and the at least on electronic device; and at least one bottom barrier layer 530.

The term chip 502 refers to an arrangement including the die 550 and the various electronic devices formed thereon (i.e. the various layers, barriers, structures, terminals, contacts and the like).

The wafer 538 and the dies 550 of the plurality of chips 502 may be formed similar as the wafer and the at least one die described above. The dies 550 of the plurality chips 502 may be formed in or over a wafer 538.

In various embodiments, the at least one electronic device may be at least one of the group of electronic devices, wherein the group of electronic devices may include or consist of: a logic device, a diode (e.g. a pn diode, a TVS diode, or a Schottky diode), a transistor, a varistor, a bipolar junction transistor, junction gate field-effect transistor, a field effect transistor, a resistor, a capacitor, an inductor, a thyristor, a power transistor, a power metal oxide semiconductor (MOS) transistor, a power bipolar transistor, a power field effect transistor, a power insulated gate bipolar transistor (IGBT), a MOS controlled thyristors, a silicon controlled rectifier, a power schottky diode, a silicon carbide diode, a gallium nitride device, an ASIC, a driver, a controller, electronic filter combination, a LC link, a passive device, a sensor, and the like.

In FIG. 5 at least an part of such an electronic device is shown. The at least one diode and/or the at least one electronic device may be formed at least partially by means of various doped regions and/or layers (e.g. 524, 526, 528, 534, and/or 536), insulating and/or passivating barriers and/or barrier layers (e.g. 514, 516, and/or 546) as will be described in more detail further below.

In case that the electronic device may be a second diode (e.g. a second TVS diode) which may be integrated by means of a series circuit, the circuit arrangement 500 may have such a double diode device having half capacity and providing bidirectional blocking behaviour. Furthermore, such a double diode arrangement may be extremely symmetrical.

The various elements (e.g. the various layers, terminals, contacts, barriers, structures, and the like) formed on each die 550 of the plurality of chips 502 may be formed by means of at least one common process, such as layer deposition, patterning, doping, and/or heat treatment.

The at least one bottom barrier layer 530 may be formed at the interface region formed by the doped layer 528 and the undoped layer 532 of each die 550 of the plurality chips 502, e.g. by means of a Si/Si interface region of the doped layer 528 and the undoped layer 532 of each die 550 of the plurality of chips 502. In other words, the at least one bottom barrier layer 530 being the interface region of the doped layer 528 and the undoped layer 532 may be formed such that charge carriers of the doped layer 528 may be kept within the doped layer 528 above the at least one bottom barrier layer 530.

The at least one bottom barrier layer 530 may have a thickness being in the range from about 1 nm to about 1 µm, e.g. in the range from about 3 nm to about 50 nm, e.g. in the range from about 5 nm to about 500 nm.

In various embodiments, in each die 550 of the plurality of chips 502 at least two doped regions, 534 and 536, may be formed, wherein the the regions may be at least one of the group of doped semiconductor types, wherein the group of doped semiconductor types may include or consist of: a p-type, a n-type, a $p^+$-type, a $n^+$-type, a $n^-$-type, or a $p^-$-type.

The at least two doped regions, 534 and 536, may be formed by means of doping the at least one semiconductor material of each die 550 of the plurality of chips 502 by at least one of the group of doping materials, wherein the group of doping materials may include or consist of: phosphorus (P), arsenic (As), antimony (Sb) and bismuth (Bi), indium (In), gallium (Ga), aluminium (Al), tellurium (Te), carbon (C), and the like.

In various embodiments, the at least two doped regions, 534 and 536, may be formed through the at least one bottom barrier layer 530 into the undoped layer 523 of the die 550 such that charge carriers of the at least two doped regions, 534 and 536, may be able to move to adjacent layers by means of an applied electric field.

The at least two doped regions, 534 and 536, may be doped differently or equally with respect to implanted amount and/or species of dopant. Moreover, the at least two doped regions, 534 and 536, may be separated from each other, e.g. by means of one or more insulation barriers 546 which may be formed laterally and between the at least two doped regions, 534 and 536, as will be described in mored detail further below.

The at least two doped regions, 534 and 536, may be formed such that their footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least two doped regions, 534 and 536, may be formed such that their body shape may formed from at least one of the group of body shapes, wherein the group of body shapes may include or consist of: a cube, a cuboid, a cylinder, a parallelepiped, a prism, and the like.

Although in FIG. 5 at least two exemplary doped regions, 534 and 536, are shown, they are not limited to this number. It is understood, that one or more doped regions (e.g. a plurality of doped regions) may be formed depending upon the number of electronic devices to be formed in the circuit arrangement 500.

In various embodiments, each die 550 of the plurality of chips 502 may be formed such that over the at least one bottom barrier layer 530 and the at least two doped regions, 534 and 536, at least one doped layer 528 may be formed, wherein the the doped layer 528 may be at least one of the group of doped semiconductor types, wherein the group of doped semiconductor types may include or consist of: a p-type, a n-type, a $p^+$-type, a $n^+$-type, a $n^-$-type, or a $p^-$type.

Although in FIG. 5 one doped layer 528 is shown, it is understood, that one or more doped layers 528 (e.g. a plurality of doped layers 528) may be formed at least partially over the at least one bottom barrier layer 530 and the at least two doped regions, 534 and 536.

The at least one doped layer 528 may be formed by means of doping the at least one semiconductor material of the at least one doped layer 528 by at least one of the group of doping materials, wherein the group of doping materials may include or consist of: phosphorus (P), arsenic (As), antimony (Sb) and bismuth (Bi), indium (In), gallium (Ga), aluminium (Al), tellurium (Te), carbon (C), and the like.

The at least one doped layer 528 may be doped differently or equally to the at least two doped regions, 534 and 536, with respect to implanted amount and/or species of dopant.

The at least one doped layer 528 may have a thickness in the range from about 100 nm to about 100 µm, e.g. in the range from about 10 nm to about 10 µm, e.g. in the range from about 100 nm to about 10 µm.

The at least one undoped layer 532 may have a thickness in the range from about 1 µm to about 1000 µm, e.g. in the range from about 50 µm to about 500 µm, e.g. in the range from about 100 µm to about 500 µm.

In various embodiments, at least two further doped regions, 524 and 526, may be formed in the at least one doped layer 528, wherein at least two further doped regions, 524 and 526, may be at least one of the group of doped semiconductor types, wherein the group of doped semiconductor types may include or consist of: p-type, n-type, $p^+$-type, $n^+$-type, $n^-$-type, $p^-$-type.

The at least two further doped regions, 524 and 526, may be doped differently or equally with respect to implanted amount and/or species of dopant. Furthermore, the at least two further doped regions, 524 and 526, may be doped differently or equally to the at least one doped layer 528 and/or the at least two doped regions, 534 and 536, with respect to implanted amount and/or species of dopant. Moreover, the at least two further doped regions, 524 and 526, may be separated from each other by means of at least one insulation barrier 546 as will be described in more detail further below.

The at least two further doped regions, 524 and 526, may be fainted by means of a further doping of the at least one semiconductor material of the at least one doped layer 528 by at least one of the group of doping materials, wherein the group of doping materials may include or consist of: phosphorus (P), arsenic (As), antimony (Sb) and bismuth (Bi), indium (In), gallium (Ga), aluminium (Al), tellurium (Te), carbon (C), and the like.

In various embodiments, the at least two further doped regions, 524 and 526, may be formed such that the at least two further doped regions, 524 and 526, may extend at least partially into the at least one doped layer 528 being substantially planar with the at least on doped layer 528.

The at least two further doped regions, 524 and 526, may be formed such that its footprint may be at least one of the group of geometric shapes, wherein the group may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least two further doped regions, 524 and 526, may be formed such that its body shape may formed from at least one of the group of body shapes, wherein the group may include or consist of: a cube, a cuboid, a cylinder, a parallelepiped, a prism, and the like.

Although in FIG. 5 two exemplary further doped regions, 524 and 526, are shown, they are not limited to this number. It is understood, that one or more further doped regions (e.g. a plurality of doped regions) may be formed depending upon the number of electronic devices to be formed in the circuit arrangement 500.

In various embodiments, the top barrier layer 516 may be formed at least partially over the at least one doped layer 528 and/or over at least one of the at least two further doped region 524 and 526. The at least one top barrier layer 516 may be formed such that charge carriers of the various doped areas in the plurality of chips 502 may be kept in a predetermined region below the at least one top barrier layer 516.

The at least one top barrier layer 516 may be formed from at least one of the group of barrier layer materials, wherein the group of barrier layer materials may include or consist of: silicon dioxide ($SiO_2$), silicon nitride (SiN), aluminum oxide ($Al_2O_3$), titanium oxide ($TiO_2$), a stack formed from at least two of barrier layer materials, such as silicon dioxide ($SiO_2$), silicon nitride (SiN), aluminum oxide ($Al_2O_3$), titanium oxide ($TiO_2$), and the like.

The at least one top barrier layer 516 may have a thickness being in the range from about 1 nm to about 1 µm, e.g. in the range from about 5 nm to about 500 nm, e.g. in the range from about 1 nm to about 100 nm.

In various embodiments, a plurality of insulating barriers 546 may be formed at least partially into the at least one doped layer 528, at least partially through the at least one bottom barrier layer 530, and at least partially into each die 550 of the plurality of chips 502 to a predetermined depth with respect to the dimensions of the at least one electronic component and/or the at least one diode. The plurality of insulating barriers 546 may be formed to allow electrically decoupling (or an isolating separation) of the at least one diode and the at least one electronic device. In other words, the plurality of insulating barriers 546 may be formed for isolating the various electronic devices formed in the circuit arrangement 500 from each other.

In this exemplary case of two electronic devices (e.g. at least one diode and/or at least one further electronic device) formed in the circuit arrangement 500 at least three insulating barriers 546 may be formed laterally and between the two exemplary electronic devices. Although in FIG. 5 two exemplary electronic devices are depicted, it is understood, that one or more electronic devices (e.g. a plurality of electronic devices) may be formed in the circuit arrangement 500 and thus, more than three insulating barriers 546 with respect to the number of electronic devices may be fainted in the circuit arrangement 500.

The plurality of insulating barriers 546 formed laterally of the electronic devices may be formed to allow insulating the electronic devices formed in between the insulating barriers 546 from further electrically conductive structures formed into the circuit arrangement 500 as will be described in more detail further below.

The plurality of insulating barriers 546 may be formed from at least one of the group of insulating materials, wherein the group of insulating materials may include or consist of: silicon dioxide ($SiO_2$), silicon nitride (SiN), aluminum oxide ($Al_2O_3$), and the like.

Each insulating barrier of the plurality of insulating barriers 546 may have a thickness, wherein the thickness may be formed with respect to the applied power to the electronic devices such that these applied currents may be shielded from each other. The thickness of each insulating barrier of the plurality of insulating barriers 546 may be in the range from about 1 nm to about 1 µm, e.g. in the range from about 10 nm to about 100 nm, e.g. in the range from about 50 nm to about 500 nm.

Each insulating barrier of the plurality of insulating barriers 546 may be formed such that its footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

Each insulating barrier of the plurality of insulating barriers 546 may be formed such that its body shape may formed from at least one of the group of body shapes, wherein the group of body shapes may include or consist of: a cube, a cuboid, a cylinder, a parallelepiped, a prism, and the like.

In various embodiments, at least one insulating top barrier layer 514 may be formed at least partially over the at least one top barrier layer 516 and the at least two further doped regions, 524 and 526. The at least one insulating top barrier layer 514 and the insulating barriers 546 may be formed to allow electronic shielding of the electronic devices formed below the at least one insulating top barrier layer 514 from the electrically conductive structures, 508, and 520, and which may be formed between the insulating barriers 546 and over the at least one insulating top barrier layer 514 as will be described in more detail further below.

Although in FIG. 5 one insulating top barrier layer 514 is shown, it is understood, that one or more insulating barrier layers 514 (e.g. a plurality of insulating barrier layers 514) may be formed at least partially over the at least one top barrier layer 516 and the at least two further doped regions, 524 and 526.

The at least one insulating top barrier layer 514 may be formed from at least one of the group of insulating materials, wherein the group of insulating materials may include or consist of: silicon dioxide (SiO$_2$), silicon nitride (SiN), aluminum oxide (Al$_2$O$_3$), and the like.

The at least one insulating top barrier layer 514 may have a thickness, wherein the thickness of the at least one insulating top barrier layer 514 may be in the range from about 1 nm to about 1 μm, e.g. in the range from about 10 nm to about 100 nm, e.g. in the range from about 50 nm to about 500 nm.

At least one first electrically conductive structure 520 which may be formed as a through-silicon-via (TSV) may be formed laterally to the plurality of insulating barriers 546, which may include the at least one electronic device, into the at least one insulating top barrier layer 514, the at least one top barrier layer 516, the at least one doped layer 528, the at least one bottom barrier layer 530, and at least partially into the undoped layer 532 of each die 550 of the plurality of chips 502, wherein the at least one first electrically conductive structure 520 (e.g. a TSV) may be formed similar as the at least one first electrically conductive structure described above. Furthermore, the predetermined depth of the TSV may be chosen with respect to the thickness of the final product after thinning the plurality of chips 502 from their second side. In other words, the depth of the at least one first electrically conductive structure 520 may be equal to or larger than the thickness of the final product. It is understood, that the TSV may be formed to allow providing current from a first side to a second side opposite the first side of the circuit arrangement 500.

Further, at least one electrically conductive contact 544 may be formed through the at least one insulating top barrier layer 514 to allow an electrically conductive coupling to the at least one diode to the at least one of second conductive structure 508 formed subsequently over the at least one insulating top barrier layer 514 as will be described in more detail further below. Further, one or more electrically conductive contacts 544 may be formed also through the at least one insulating top barrier layer 514 as will be described in more detail further below.

The at least one electrically conductive contact 544 may be formed from at least one of the group of electrically conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one electrically conductive contact 544 may be formed such that its footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The at least one electrically conductive contact 544 may be formed such that its body shape may formed from at least one of the group of body shapes, wherein the group of body shapes may include or consist of: a cube, a cuboid, a cylinder, a parallelepiped, a prism, and the like.

Further, one or more electrically conductive contacts 518 (e.g. the depicted exemplary three electrically conductive contacts 518 or a plurality of electrically conductive contacts 518) may be formed through the at least one insulating top barrier layer 514 to allow an electrically conductive coupling from the at least one electronic device to the at least one second electrically conductive structure 508 formed subsequently over the at least one insulating top barrier layer 514 as will be described in more detail further below.

The one or more electrically conductive contacts 518 may be formed from at least one of the group of electrically conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The one or more electrically conductive contacts 518 may be formed such that their footprint may be at least one of the group of geometric shapes, wherein the group of geometric shapes may include or consist of: a circle, a square, a rectangle, a rhombus, a trapezoidal, a parallelogram, a triangle, an ellipse, a pentagon, a hexagon, a heptagon, an octagon, a nonagon, a polygon, and the like.

The one or more electrically conductive contacts 518 may be formed such that their body shapes may formed from at least one of the group of body shapes, wherein the group of body shapes may include or consist of: a cube, a cuboid, a cylinder, a parallelepiped, a prism, and the like.

At least one second electrically conductive structure 508 may be formed at least partially over the at least one insulating top barrier layer 514, wherein the at least one second electrically conductive structure 508 may be electrically conductively coupled at least to the at least one first electrically conductive structure 520.

Although in FIG. 5 one second electrically conductive structure 508 is shown, it is understood, that one or more second electrically conductive structures 508, such as a plurality of second electrically conductive structures 508, may be formed at least partially over the at least one insulating top barrier layer 514.

The at least one second electrically conductive structure 508 may be at least laterally electrically conductively coupled to the at least one first electrically conductive structure 520 and to the at least one electronic device and/or to the at least one diode via the respective one or more electrically conductive contacts, 544 and 518.

The at least one second electrically conductive structure 508 may be formed from at least one of the group of electrically conductive materials, wherein the group of electrically conductive materials may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The at least one second electrically conductive structure 508 may have a thickness, wherein the thickness of the second electrically conductive structure 508 may be in the range from about 1 nm to about 1 μm, e.g. in the range from about 50 nm to about 500 nm, e.g. in the range from about 100 nm to about 500 nm In various embodiments, the at least one first electrically conductive structure 520, the at least one second electrically conductive structure 508 may be formed as an electrically conductive track.

In various embodiments, at least one insulating structured top layer 504 may be formed at least partially over the at least one second electrically conductive structure 508 and over the at least one insulating top barrier layer 514.

Although in FIG. 5 one insulating structured top layer 504 is shown, it is understood, that one or more insulating structured top layers 504 (e.g. a plurality of insulating structured top layers 504) may be formed at least partially over the at least one second electrically conductive structure 508 and over the at least one insulating top barrier layer 514. It is to be noted that the second electrically conductive structure 508 electrically conductively couples the first terminal and the first electrically conductive structure.

The at least one insulating structured top layer 504 may be formed at least partially such that predetermined regions of the at least one second electrically conductive structure 508 may be exposed optionally at least partially to allow forming one or more various terminals, such as the three exemplary terminals: the at least one first terminal 506A, the at least one second terminal 506B, and the at least one third terminal 506 C. In various embodiments, the openings through the passivation may be omitted, thus, the passivation may be closed.

The at least one insulating structured top layer 504 having exposed regions which may be formed by means of at least one of the group of structuring methods, wherein the group of structuring methods may include or consist of: etching (e.g. dry- and wet etching), plasma etching, sputtering, laser ablation, e-beam, nanoimprint, or ion beam lithography, scanning electrochemical imprinting, heat treatment, annealing, and the like.

The at least one insulating structured top layer 504 may be formed from at least one of the group of insulating materials, wherein the group of insulating materials may include or consist of: silicon dioxide ($SiO_2$), silicon nitride (SiN), aluminum oxide ($Al_2O_3$), and the like.

The at least one insulating structured top layer 504 may have a thickness, wherein the thickness of the at least one insulating structured top layer 504 may be in the range from about 1 nm to about 1 μm, e.g. in the range from about 10 nm to about 100 nm, e.g. in the range from about 50 nm to about 500 nm.

At least one trench 540 may be formed at least partially between two individual chips 502 formed over each die 538 of the plurality of chips 502.

The at least one trench 540 may be formed to a predetermined depth which may be deeper than the desired thickness of the final product after thinning from the back side of the circuit arrangement thereby allowing separating the plurality of the chips 502.

The at least one trench 540 may have a predetermined width depending at least upon the width of the at least one kerf which may be formed by means of dicing subsequently the plurality of chips 502

The at least one trench 540 may be formed by at least one of the group of trench forming methods, wherein the group of trench forming methods may include or consist of: mechanical sawing, etching (e.g. dry- and wet etching), plasma etching, laser ablation, and the like.

The at least one trench 540 may be formed having at least one of the group of cross-sectional areas shapes, wherein the group of cross-sectional shapes may include or consist of: semi-circle, a semi-ellipse, a triangle, a square, a rectangle, a trapezoid, a polygon, and the like.

Further, the circuit arrangement 500 may provide a redistribution layer (not shown) formed subsequently over the main processing side or a second side opposite the main processing side of the final product.

Figure 6:
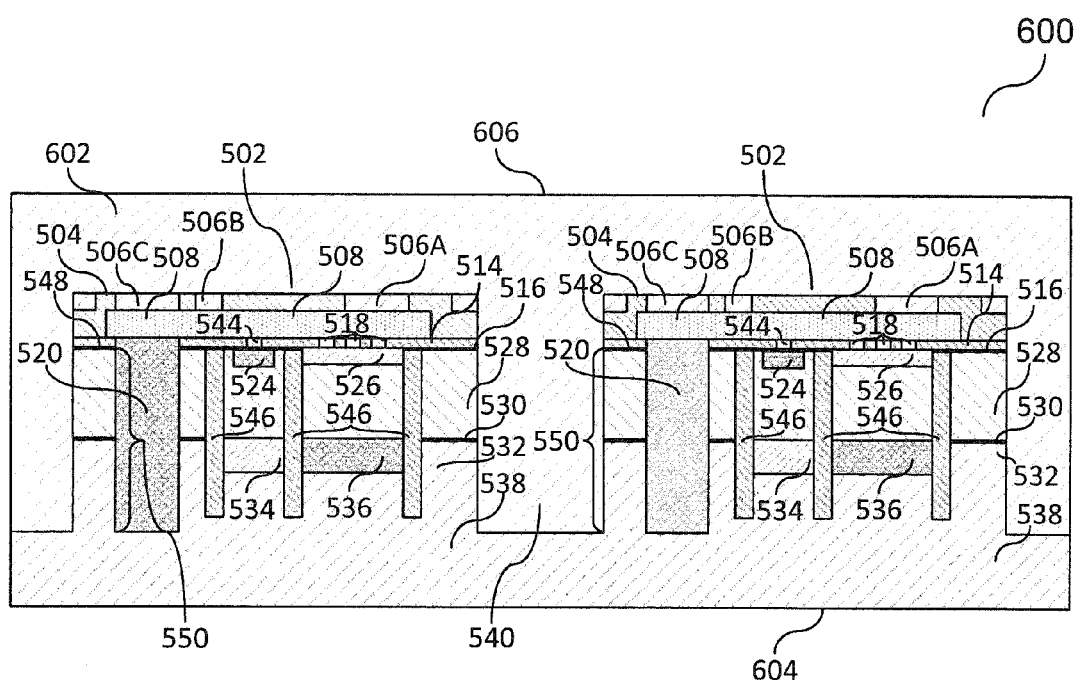
FIG. 6 shows a circuit arrangement according to various embodiments.

FIG. 6 shows a circuit arrangement 600 according to various embodiments. The circuit arrangement 600 may include the circuit arrangement 500 as described above.

An encapsulation material (e.g. a mold compound) 602 may be formed at least partially over the circuit arrangement 500 such that at least each chip of the plurality of chips 502 may be covered at least partially by the encapsulation material 602. Furthermore, the encapsulation material 602 may be formed in the at least one trench 540 such that the sidewalls of each chip of the plurality of chips 502 may be covered by the encapsulation material 602.

In various embodiments, the encapsulation material 602 may cover each chip of the plurality of chips 502 and the at least one trench 540 such that a closed flat layer may be formed over the plurality of chips 502 such as a covering layer.

The encapsulation material 602 may be similar to the encapsulation material as described above, wherein the encapsulation material 602 may be a mold compound such as used typically for embedded wafer level ball grid array packaging technology.

In various embodiments, the encapsulation material 602 may be formed over the plurality of chips 502 by means of e.g. pressing, compressing, grouting, injection, and the like.

Figure 7:
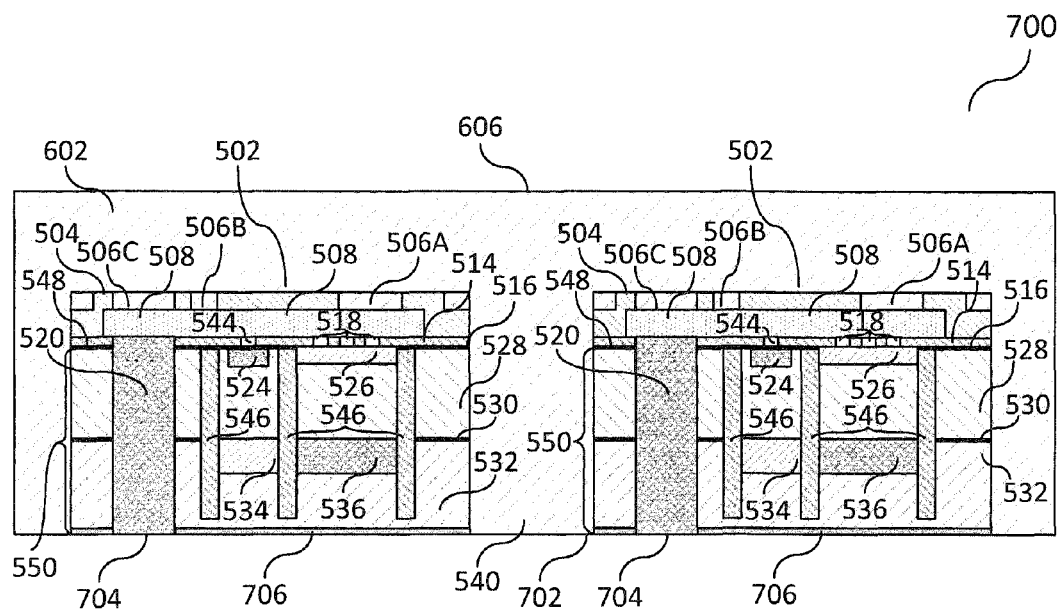
FIG. 7 shows a circuit arrangement according to various embodiments.

FIG. 7 shows a circuit arrangement 700 according to various embodiments. The circuit arrangement 700 may include the circuit arrangement 600 as described above.

The circuit arrangement 600 may be referred to as a silicon-mold combi-wafer, wherein these both terms may be utilized synonymously herein. The silicon-mold combi-wafer may have a front side 606 and a rear side 602 opposite the front side 606, wherein the front side 606 may be a side where the encapsulation material 602 may be formed. The rear side 602 may be the back side of the wafer 538.

The circuit arrangement 600 may be thinned subsequently, e.g. by means of grinding, from the rear side 602 to a predetermined thickness of final product, wherein the thickness of the final product may be e.g. equal to or less than 400 μm, e.g. equal to or less than 300 μm, e.g. equal to or less than 200 μm, e.g. equal to or less than 100 μm, e.g. equal to or less than 75 μm, or e.g. equal to or less than 50 μm.

The encapsulation material 602 may provide or serve as an auxiliary support (or carrier) for the plurality of chips 502 such that the plurality of chips 502 may be kept together in the encapsulation material 602 and thus, allow further process steps which may allow for preventing a further pick and place process of the plurality of chips 502.

The circuit arrangement 700 may have the front side 606 and a rear side 702 after thinning. Various regions of the first electrically conductive structure 520 (e.g. a TSV), the back side 706 of the at least one diode and/or the at least one electronic device may be exposed and thus, the at least one fourth terminal 704 may be exposed.

The back side 706 of the at least one diode and/or the at least one electronic device and the at least one fourth terminal 704 may be exposed by means of at least one of exposuring methods, wherein the group of exposuring methods may include or consist of: etching (e.g. dry- and wet etching), plasma etching, laser ablation, grinding, and the like.

Although in FIG. 7 one fourth terminal 704 is shown, it is understood, that one or more fourth terminals 704 (e.g. a plurality of fourth terminals 704) may be formed with respect to the number of the at least one first electrically conductive structure 520.

Furthermore, singularizing or individualizing of the plurality of chips 502 may be performed by means of thinning the circuit arrangement 600 to a predetermined thickness, wherein this thickness may be distance which may be equal to or less than the depth of the at least one trench 540 (e.g. equal to or less than 50 μm).

The encapsulation material 602 may provide or serve as an auxiliary support (or carrier) after thinning the plurality of chips 500 which may be held mechanically by the encapsulation material 602.

Figure 8:
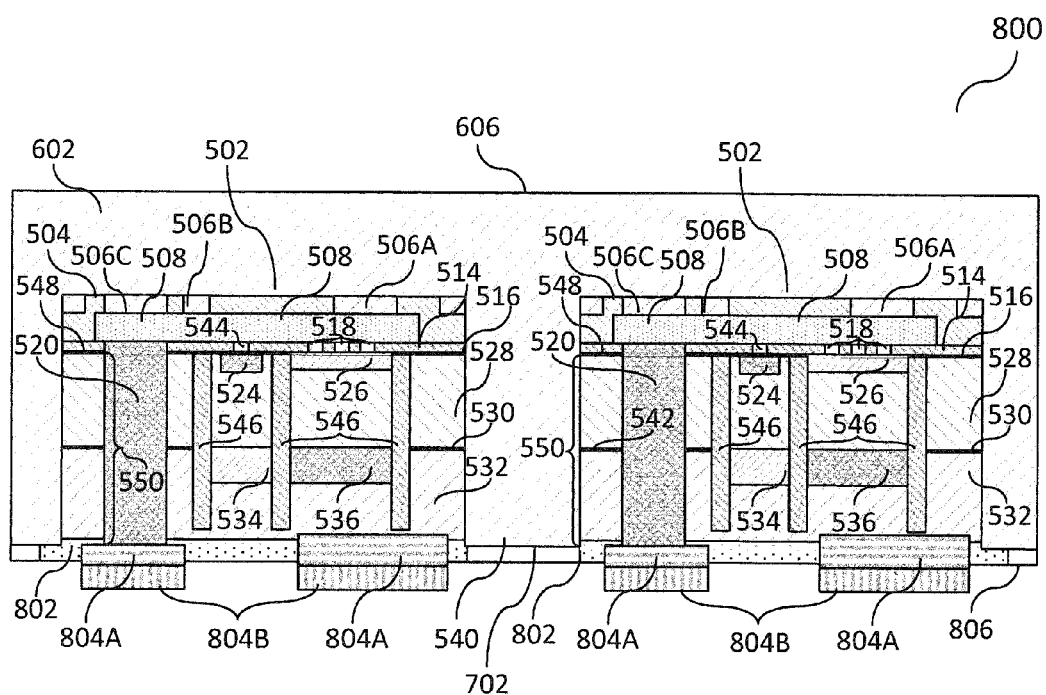
FIG. 8 shows a circuit arrangement according to various embodiments.

FIG. 8 shows a circuit arrangement 800 according to various embodiments. The circuit arrangement 800 may include the circuit arrangement 700 as described above.

In various embodiments, the inactive regions on the rear side 702 of the circuit arrangement 700 may be passivated at least partially by means of forming at least partially at least one passivation layer 802 over at least the various inactive regions at the rear side 702 of the circuit arrangement 700. Such inactive regions may be regions on the rear side 702 of the circuit arrangement 700, where e.g. an accidental current flow may be prevented by means of passivating the inactive regions.

Although in FIG. 8 one passivation layer 802 at each chip of the plurality of chips 502 is shown, it is understood, that one or more passivation layers 802 (e.g. a plurality of passivation layers 802) may be formed at least partially over the inactive regions.

The at least one passivation layer 802 may be formed from at least one of the group of passivation materials, wherein the group of passivation materials may include or consist of: polymers, polyimide (PI), polyamide (PA), Polyamide-imide (PAI), poly(methyl glutarimide) (PMGI), SU-8, Phenol formaldehyde resins (PF), Poly(methyl methacrylate) (PMMA), silicon dioxide ($SiO_2$), silicon nitride (SiN), aluminum oxide ($Al_2O_3$), titanium oxide ($TiO_2$), tantalum oxide, any combination of such materials, and the like.

The at least one passivation layer 802 may be formed such that predetermined active regions at the rear side 702 may be exposed. The active regions may be regions at the rear side 702 where a current flow may be provided, such as from the fourth terminal 704 or from at least one of the electronic devices.

In various embodiments, after forming the passivation layer 802, one or more structured back side metal-silicon contacts (e.g. ohmic contacts), 804A and/or 804B, may be formed over the active regions.

In various embodiments, by means of a first process step, at least one first electrically conductive layer 804A, such as a metal layer, a metal alloy layer, or a metal compound layer, may be formed over the active regions and subsequently, at least one second electrically conductive layer 804B, such as a metal layer, a metal alloy layer, or a metal compound layer may be formed optionally over the first electrically conductive layer 804A, wherein one or more electrically conductive layers, 804A and/or 804B, may be formed, such as a stack of such electrically conductive layers. The structured metal-silicon contact (e.g. an ohmic contact) including e.g. the both layers, 804A and 804B, may be formed e.g. by means of galvanically or electrolessly plated conductive contact and/or at least one sputter process, as described above.

However, also one or more electrically conductive layers may be formed such that a structured back side metal-silicon contact may be formed, such as a plurality of electrically conductive layers forming a stack including a plurality of electrically conductive layers. The various electrically conductive layers, 804A and/or 804B, may be formed from at least one of the group of metals, wherein the group of metals may include or consist of: copper (Cu), silver (Ag), gold (Au), nickel (Ni), aluminum (Al), platinum (Pt), titanium (Ti), tantalum (Ta), tungsten (W), molybdenum (Mo), palladium (Pd), cobalt (Co), indium (In), tin (Sn) copper alloys, silver alloys, gold alloys, aluminum alloys, platinum alloys, titanium alloys, tantalum alloys, tungsten alloys, nickel alloys, cobalt alloys, molybdenum alloys, palladium alloys, indium alloys, tin alloys, copper compounds, silver compounds, gold compounds, aluminum compounds, platinum compounds, titanium compounds, tantalum compounds, tungsten compounds, nickel compounds, molybdenum compounds, palladium compounds, cobalt compounds, indium compounds, tin compounds, and the like.

The structured metal-silicon contact further may be structured by means of at least one of the group of structuring methods, wherein the group of structuring methods may include or consist of: etching (e.g. dry- and wet etching), plasma etching, sputtering, laser ablation, e-beam, nanoimprint, or ion beam lithography, scanning electrochemical imprinting, heat treatment, annealing, and the like.

In case of a TSV, the back side contact may be formed as a structured back side metal/through-silicon-via contact, wherein this structured back side metal/through-silicon-via contact may be formed similar to the structured metal-silicon contact as described above.

Figure 9:
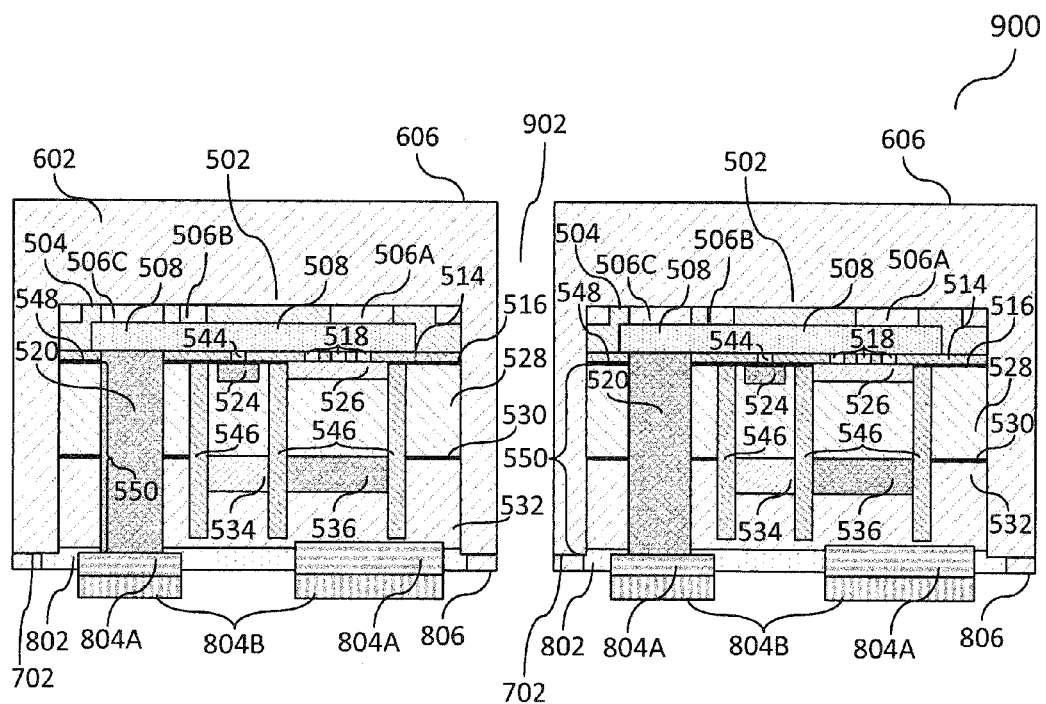
FIG. 9 shows a circuit arrangement according to various embodiments.

FIG. 9 shows a circuit arrangement 900 according to various embodiments. The circuit arrangement 900 may include the circuit arrangement 800 as described above.

After the structured back side contacts may be fainted, the plurality of chips 502 may be singularized (i.e. diced or individualized). Dicing the plurality of chips 502 may be performed by means of at least one of the group of dicing methods, wherein the group of dicing methods may include or consist of: mechanical cutting, mechanical sawing, etching (e.g. dry- and wet etching), plasma etching, laser ablation, and the like.

The dicing of the plurality of chips 502 may be performed such that the at least one kerf 902 for separating the plurality of chips 502 by at least one of the dicing methods may have a thickness which may be smaller than the at least one trench 540 formed previously. Thus, the encapsulation material 602 may cover at least partially each sidewall of the plurality of chips 502, also after dicing the plurality of chips 502 and therefore, the plurality of chips 502 may be packaged at least partially after the dicing process, wherein at least the rear side 702 including the structured back side contacts, 804A and 804B, may be exposed.

In various embodiments, an arrangement may be provided. The arrangement may include: a die including at least one electronic component and a first terminal on a first side of the die and a second terminal on a second side of the die opposite the first side, wherein the first side being the main processing side of the die, and the die further including at least a third terminal on the second side; a first electrically conductive structure providing current flow from the third terminal on second side of the die to the first side of the die through the die; a second electrically conductive structure on the first side of the die laterally coupling the first terminal with the first electrically conductive structure; and an encapsulation material disposed at least over the first side of the die covering the first terminal, and the second electrically conductive structure.

In various embodiments, the first side and the second side of the die may include at least one electrically conductive (e.g. ohmic) contact.

In various embodiments, the first side and the second side of the die may include at least a galvanically or electrolessly plated conductive contact.

In various embodiments, the first side and the second side of the die may include at least a sputtered conductive contact.

In various embodiments, the die may have at least a thickness of less than or equal to 75 µm.

In various embodiments, at least one redistribution structure may be formed on the first side of the die coupled electrically to the first terminal.

In various embodiments, at least one sidewall of the die may be covered at least partially by means of the encapsulation material.

In various embodiments, at least one of the first electrically conductive structure and the second electrically conductive structure may include an electrically conductive conductor track.

In various embodiments, a circuit arrangement may be provided. The circuit arrangement may include: a die including at least one electronic component and a first terminal on a first side of the die and a second terminal on a second side of the die opposite the first side, the die further including at least a third terminal on the second side; a first electrically conductive structure providing current flow from the third terminal on the second side of the die to first side of the die through the die; a second electrically conductive structure deposited on the first side of the die and laterally coupling the first terminal with the first electrically conductive structure, wherein the second electrically conductive structure may formed by means of a wafer level interconnect structure; and an encapsulation material disposed at least over the first side of the die covering the first terminal, and the second electrically conductive structure.

In various embodiments, the first side and the second side of the die may include at least one electrically conductive (ohmic) contact.

In various embodiments, the first side and the second side of the die may include at least a galvanically or electrolessly plated conductive contact.

In various embodiments, the first side and the second side of the die may include at least one sputtered conductive contact.

In various embodiments, the die may have at least a thickness of less than or equal to 75 µm.

In various embodiments, at least one redistribution structure may be formed on the first side of the die coupled electrically to the first terminal.

In various embodiments, at least one sidewall of the die may be covered at least partially by means of the encapsulation material.

In various embodiments, at least one of the first electrically conductive structure and the second electrically conductive structure may include an electrically conductive conductor track.

In various embodiments, a method for manufacturing a circuit arrangement may be provided. The method may include: forming a plurality of dies in a wafer, each die including at least one electronic component, a first terminal, on a first side of the wafer and a second terminal on a second side of the wafer opposite the first side of the die, wherein each die further may include at least a third terminal on the second side and the first side of the die may be the main processing side of the die; forming a first electrically conductive structure through each die providing current flow from the respective third terminal on the second side of the die to the first side of the die through the respective die; forming a second electrically conductive structure on the first side of each die laterally coupling the respective first terminal with the respective first electrically conductive structure; and forming encapsulation material over the first side of the wafer covering the plurality of dies.

In various embodiments, the method may further include: forming trenches into the wafer between the dies; wherein the encapsulation material may be formed at least partially on the sidewalls of the trenches.

In various embodiments, the method may further include removing wafer material from the second side to at least partially expose the encapsulation material formed in the trenches.

In various embodiments, the second terminal and the third terminal may be formed on the second side of the dies after the process of removing wafer material from the second side of the dies.

In various embodiments, the method may further include: forming an insulating layer over the second side of the dies after the process of removing wafer material from the second side of the dies; and forming openings in the insulating layer to expose the first electrically conductive structure and at least a portion of the wafer material; wherein the second terminal and the third terminal may be formed on the second side of the dies in the openings.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An arrangement, comprising:
a die comprising at least one electronic component and a first terminal on a first side of the die and a second terminal on a second side of the die opposite the first side, the first side being the main processing side of the die, the die further comprising at least a third terminal on the second side;
a first electrically conductive structure providing current flow from the third terminal on second side of the die to the first side through the die;
a second electrically conductive structure on the first side of the die laterally coupling the first terminal with the first electrically conductive structure; and
an encapsulation material disposed at least over the first side of the die covering the first terminal and the second electrically conductive structure.

2. The arrangement of claim 1, wherein the first side and the second side of the die comprise at least one electrically conductive contact.

3. The arrangement of claim 1, wherein the first side and the second side of the die comprise at least a galvanically or electrolessly plated conductive contact.

4. The arrangement of claim 1, wherein the first side and the second side of the die comprise at least a sputtered conductive contact.

5. The arrangement of claim 1, wherein the die has at least a thickness of less or equal 75 µm.

6. The arrangement of claim 1, wherein at least one redistribution structure is disposed on the first side of the die and electrically coupled to the first terminal.

7. The arrangement of claim 1, wherein at least one sidewall of the die is covered at least partially by means of the encapsulation material.

8. The circuit arrangement of claim 1, wherein at least one of the first electrically conductive structure and the second electrically conductive structure comprises an electrically conductive conductor track.

9. A circuit arrangement, comprising:
a die comprising at least one electronic component and a first terminal on a first side of the die and a second terminal on a second side of the die opposite the first side,
the die further comprising at least a third terminal on the second side;
a first electrically conductive structure providing current flow from the third terminal on the second side of the die to the first side of the die through the die;
a second electrically conductive structure deposited on the first side of the die and laterally coupling the first terminal with the first electrically conductive structure, wherein the second electrically conductive structure is formed by means of a wafer level interconnect structure;
an encapsulation material disposed at least over the first side of the die covering the first terminal and the second electrically conductive structure.

10. The circuit arrangement of claim 9, wherein the first side and the second side of the die comprise at least one electrically conductive contact.

11. The circuit arrangement of claim 9, wherein the first side and the second side of the die comprise at least a galvanically or electrolessly plated conductive contact.

12. The circuit arrangement of claim 9, wherein the first side and the second side of the die comprise at least a sputtered conductive contact.

13. The circuit arrangement of claim 9, wherein the die has at least a thickness of less or equal 50 µm.

14. The circuit arrangement of claim 9, wherein at least one redistribution structure is disposed on the first side of the die and electrically coupled to the first terminal.

15. The circuit arrangement of claim 9, wherein at least one sidewall of the die is covered at least partially by means of the encapsulation material.

16. The circuit arrangement of claim 9, wherein at least one of the first electrically structure and the second electrically conductive structure comprises an electrically conductive conductor track.

* * * * *